United States Patent
Chen et al.

(10) Patent No.: US 10,094,033 B2
(45) Date of Patent: Oct. 9, 2018

(54) ELECTRODEPOSITED NANO-TWINS COPPER LAYER AND METHOD OF FABRICATING THE SAME

(71) Applicant: National Chiao Tung University, Hsinchu (TW)

(72) Inventors: Chih Chen, Hsinchu (TW); King-Ning Tu, Hsinchu (TW); Taochi Liu, Hsinchu County (TW)

(73) Assignee: National Chiao Tung University, Hsinchu (TW)

( * ) Notice: Subject to any disclaimer, the term of this patent is extended or adjusted under 35 U.S.C. 154(b) by 100 days.

(21) Appl. No.: 15/238,345

(22) Filed: Aug. 16, 2016

(65) Prior Publication Data

US 2016/0355940 A1 Dec. 8, 2016

Related U.S. Application Data

(62) Division of application No. 13/679,154, filed on Nov. 16, 2012, now Pat. No. 9,476,140.

(30) Foreign Application Priority Data

Nov. 16, 2011 (TW) .............................. 100141898 A

(51) Int. Cl.
*C25D 3/38* (2006.01)
*C25D 5/08* (2006.01)
(Continued)

(52) U.S. Cl.
CPC ................. *C25D 3/38* (2013.01); *C25D 5/08* (2013.01); *C25D 5/18* (2013.01); *C25D 21/10* (2013.01);
(Continued)

(58) Field of Classification Search
CPC ....................................................... C25D 3/38
(Continued)

(56) References Cited

U.S. PATENT DOCUMENTS

| 6,242,349 B1 | 6/2001 | Nogami et al. |
| 6,544,663 B1 | 4/2003 | Nakano et al. |

(Continued)

FOREIGN PATENT DOCUMENTS

| CN | 102400188 A | * | 4/2012 |
| TW | 483292 B | | 4/2002 |

OTHER PUBLICATIONS

Jang et al, "Deformation mechanism in nanotwinned metal nanopillars" Nature Nanotechnology, vol. 7, Sep. 2012, p. 594-601. (Year : 2012).*

(Continued)

*Primary Examiner* — Brian W Cohen
(74) *Attorney, Agent, or Firm* — Muncy, Geissler, Olds & Lowe, P.C.

(57) ABSTRACT

An electrodeposited nano-twins copper layer, a method of fabricating the same, and a substrate comprising the same are disclosed. According to the present invention, at least 50% in volume of the electrodeposited nano-twins copper layer comprises plural grains adjacent to each other, wherein the said grains are made of stacked twins, the angle of the stacking directions of the nano-twins between one grain and the neighboring grain is between 0 to 20 degrees. The electrodeposited nano-twins copper layer of the present invention is highly reliable with excellent electro-migration resistance, hardness, and Young's modulus. Its manufacturing method is also fully compatible to semiconductor process.

14 Claims, 8 Drawing Sheets

(51) Int. Cl.

| | |
|---|---|
| *C25D 5/18* | (2006.01) |
| *C25D 7/12* | (2006.01) |
| *C25D 21/10* | (2006.01) |
| *C30B 7/12* | (2006.01) |
| *C30B 29/60* | (2006.01) |
| *C30B 29/02* | (2006.01) |
| *H01L 21/288* | (2006.01) |
| *H01L 21/768* | (2006.01) |

(52) U.S. Cl.
CPC ............. *C30B 7/12* (2013.01); *C30B 29/02* (2013.01); *C30B 29/605* (2013.01); *H01L 21/2885* (2013.01); *H01L 21/76877* (2013.01); *H01L 21/76898* (2013.01); *Y10T 428/12674* (2015.01); *Y10T 428/12903* (2015.01)

(58) Field of Classification Search
USPC .................................................. 205/291–298
See application file for complete search history.

(56) References Cited

U.S. PATENT DOCUMENTS

| | | | |
|---|---|---|---|
| 6,670,639 | B1 | 12/2003 | Okabayashi et al. |
| 7,736,448 | B2 | 6/2010 | Lu et al. |
| 2002/0015833 | A1* | 2/2002 | Takahashi ............... C25D 1/04 428/209 |
| 2010/0052162 | A1 | 3/2010 | Iijima |
| 2012/0135260 | A1* | 5/2012 | Jang ....................... C25D 5/022 428/546 |

OTHER PUBLICATIONS

Liu et al, "Fabrication and Characterization of (111)-Oriented and Nanotwinned Cu by DC Electrodeposition" Crystal Growth & Design, vol. 12, 2012, p. 5012-5016. (Year: 2012).*
Hsiao et al, "Unidirectional Growth of Microbumps on (111)-Oriented and Nanotwinned Copper" Science, vol. 336, May 2012, p. 1007-1010. (Year: 2012).*
Machine translation of CN102400188 of Shuai et al. (Year: 2012).*
Lu et al., "Revealing the Maximum Strengh of Nanotwinned Copper". Science, vol. 323, 2009, p. 607-610. (Year: 2009).*
O. Anderoglu, A. Misra, H. Wang and X. Zhang, Thermal stability of sputtered Cu films with nanoscale growth twins, J. Appl. Phys. 103, 094322 (2008).
Bulusu V. Sarada, Ch. L. P. Pavithra, M. Ramakrishna, Tata N. Rao and G. Sundararajan, Highly (111) Textured Copper Foils with High Hardness and High Electrical Conductivity by Pulse Reverse Electrodeposition, Electrochemical and Solid-State Letters, 13 (6) D40-D42 (2010).
Zhang, Xi; Tu, K. N.; Chen, Zhong; Tan, Y. K.; Wong, C. C.; Mhaisalkar, S. G.; Li, X. M.; Tung, C. H.; Cheng, C. K., Pulse Electroplating of Copper Film: A Study of Process and Microstructure, Journal of Nanoscience and Nanotechnology, vol. 8, No. 5, May 2008, pp. 2568-2574(7).
Lu et al., Nano-sized twins induce high rate sensitivity of flow stress in pure copper, 2005, Act Materialia, vol. 53, pp. 2169-2179.
Dixit et al., Fabrication and characterization of fine pitch on-chip copper interconnects for advanced wafer level packaging by a high aspect ratio through AZ9260 resist electroplating, Apr. 24, 2007, J. Micromech. Microeng., vol. 17, pp. 1078-1086.

* cited by examiner

US 10,094,033 B2

ELECTRODEPOSITED NANO-TWINS COPPER LAYER AND METHOD OF FABRICATING THE SAME

CROSS-REFERENCE TO RELATED APPLICATIONS

This present application is a Divisional of co-pending application Ser. No. 13/679,154, filed on Nov. 16, 2012, for which priority is claimed under 35 U.S.C. § 120; and this application claims priority of Taiwanese Patent Application No. 100141898 filed on Nov. 16, 2011 under 35 U.S.C. § 119, the entire contents of all of which are hereby incorporated by reference.

BACKGROUND OF THE INVENTION

1. Field of the Invention

The present invention relates to a method for preparing electrodeposited nano-twins copper layer and the nano-twins copper layer prepared by the same, more particularly, to a method for preparing a nano-twins copper layer having a plurality of [111] surfaces on its surface and the nano-twins copper layer thereof.

2. Description of Related Art

Mechanical strength of metallic material increases generally when the size of the crystal grain is reduced to a nanoscale level. Some nano-scale levels of thin metal films can even have particular mechanical properties such— Young's coefficient. As a result, twins metal having nanoscale crystalline properties will be suitable for applications of through silicon via, semiconductor chip interconnect, packaging substrate pin through hole, metal interconnect (for example, copper interconnect), or metal materials on substrate.

In terms of electrical performance of microelectronic devices, electromigration has become a critical reliability issue of Cu wires. From the disclosure of the past research, three methods have been discovered to increase the electromigration lifetime of the wires.

The first method is to fabricate the Cu grain structure with a [111] preferred orientation, so as to significantly enhance electro-migration resistance, and reduce the possibility of formation of voids caused by electro-migration.

The second method is to increase the grain size to decrease the area of grain boundary, and to further reduce the migration path of atoms. The third method is to add metals having nano-twins structure into the wires. The atoms move along the direction of the moving electrons and result in electro-migration damage. Moreover, the electromigration rate can be retarded at twin boundaries. In the spirit of this working principle, nano-twins can inhibit the formation of voids in the interconnect, and directly improve the lifetime of electrical devices. In other words, the higher the nano-twins density inside the interconnect is, the better anti electro-migration will be.

Generally, nano-twins copper metal layer is prepared through physical vapor phase deposition (PVD) or pulse electroplating. But the twins material prepared by these known technologies illustrated above can only obtain miniscaled and irregular nano-twins, and suffer high production cost. In addition, PVD cannot fill Cu in trenches or vias with a high-aspect ratio. Hence, these known methods are not widely applied in mass production of semiconductor and electronic products. In other words, these methods still cannot be applied in industrial mass production.

Several researchers disclosed the details of forming nano-twins copper metal layers. For example, O. Anderoglu et al. disclosed a way for preparing a nano-twins copper metal layer structure by physical vapor deposition (PVD). The thickness of a single crystal grain can reach only hundreds of nanometer, and only applicable for use in preparing seed layers. (O. Anderoglu, A. Misra, H. Wong, and X. Zhang, Thermal stability of sputtered Cu films with nanoscale growth twins, Journal of Applied Physics 103, 094322, 2008). In addition, because physical vapor phase deposition inherently cannot plate a concaved trough of a high aspect ratio well and deposition duration is long, neither structure nor its preparative method is applicable for use in copper interconnects, through silicon via, or under-bump metallization (UBM), etc.

On the other hand, Xi Zhang et al. disclosed another way for producing nano-twins copper film through copper sulfate solution, and pulse electrodeposition device. One drawback of the known technology comes from the fact that the size of produced crystal grains is too small, the twins copper growth orientation cannot be controlled, and the pulsed electrodeposition rate is -low. Hence, its economic benefits downgrade. (Xi Zhang, K. N. Tu, Zhang Chen, Y. K. Tan, C. C. Wong, S. G. Mhaisalkar, X. M. Li, C. H. Tung, and C. K. Cheng. Pulse Electroplating of Copper Film: A Study of Process and Microstructure, Journal of Nanoscience and Nanotechnology, VOL 8, 2568-2574, 2008).

U.S. Pat. No. 6,670,639B1 discloses a copper interconnection, wherein 50% of the crystal grains of the copper or copper alloy inside the interconnect are arranged in a uniform [111] crystal orientation, and connects with crystal grains of other crystal orientation to form a bamboo structure, and to form double crystal lattice on the wire surface. The efficacy of the structure illustrated is to increase high reliability and to lower production cost. However, although the prior art can offer high reliability and low production cost, it cannot offer the anti electro-migration as present with nano-twins at the same time.

U.S. Pat. No. 7,736,448B2 discloses a preparative method for twins-copper interconnect using "pulsed electrodeposition". The density of the twins layer prepared thereof is high, but the crystal grain size is merely 300 nm-1000 nm, which are random, orderless small size isometric crystal grains. Furthermore, the range of operation for the electric current density of the disclosed pulse electrodeposition in the said technology is limited to be within 4 mA/cm$^2$-10 mA/cm$^2$, and the film plating deposition rate is overly slow. Therefore, the materials' economic value is deprived by the shortcoming illustrated above.

In summary, there are generally two drawbacks with the prior arts: (1) the grain orientation therein is difficult to master. Only copper grains with random orientations can be fabricated, and its effect on improving product efficacy is limited when used in interconnect or contact points; (2) prior arts' deposition speed is low despite of use of pulse plating or physical vapor phase deposition. Its deposition duration is long, efficacy is low, and production cost is high. In other words, it cannot compete against other products with respect to large-scale production.

Accordingly, the microelectronics industry needs a nano-twins copper metal layer having a [111] preferred orientation, so as to come up with the most favorable anti electro-migration for wires. At the same time, there is a need for nano-twins copper metal materials having excellent mechanical property, and the preparative method is also fast, and low cost. Moreover, the preparative method is compatible with current semiconductor manufacturing, which is believed to be in line for replacing directly the applicability value of the traditional interconnect or contact materials.

SUMMARY OF THE INVENTION

One main object of the present invention is to provide an electrodeposited nano-twins copper metal layer and a preparative method thereof. The nano-twins copper metal layer herein has improved anti electro-migration, hardness, and Young's coefficient. These improved properties are ideal for significantly enhancing the electromigration reliability for electronic products, keeping down production cost, and making the material and the production thereof compatible with modern semiconductor manufacturing.

In the electrodeposited nano-twins copper metal layer of the present invention, over 50% of a volume of the nano-twins copper metal layer comprises a plurality of crystal grains, wherein each of the plurality of crystal grains is connected with one another, and each crystal grain is formed as a result of the plurality of nano-twins working to stack in the direction of the [111] crystal axis, for which an angle included between neighboring crystal grains is 0° to 20° in a stacking direction, more preferably 0° to 10°, and most preferably 0°.

The electrodeposited nano-twins copper metal layer of the present invention features a structure completely different from the commonly known arts. In particular, the nano-twins copper metal has grains having substantially preferred direction in [111] and in the meantime highly dense nano-twins. The thickness of the electrodeposited film can even reach approximately above 20 micrometers (even above hundreds of micrometers). The density of the nano-twins in the whole metal material surpasses those produced by commonly known arts, and can possess outstanding anti electro-migration and mechanical characteristics. In other words, the electrodeposited nano-twins copper metal layer of the present invention is suitable for mass production.

The present invention uses electrodeposition as a means to produce nano-twins copper metal layer having a preferred direction. The nano-twins copper metal layer of the present invention has at least 50% of surface area being [111] surface, meaning that a [111] surface is exposed on over 50% of surface area. Furthermore, an angle included between the direction of crystal axis [111] of the grains and its growth direction is within 20°, and it is preferred that the grain has essentially the same direction of [111].

In the present invention, the thickness of electrodeposited nano-twins copper metal layer can vary according to the direction of electrodeposition, for which it is preferred to be approximately 0.1 µm, making it only applicable for use as seed layer, and not capable for more straight forward application as in wires. The thickness of electrodeposited nano-twins copper metal layer, on the other hand, can be 0.1 µm-500 µm, and its industrial application can therefore be very diverse (for example, through silicon via, semiconductor chip interconnect, pin through hole, or metal interconnect).

As shown in the three-dimensional perspective diagrams of the cross-sectional diagram of FIG. 2A and FIG. 2B, the electrodeposited nano-twins copper metal layer 14 of the present invention comprises considerable number of crystal grains 16, and each crystal grain has plural layer-shaped nano-twins copper (for example, neighboring sets of black lines and white lines constitute a twins copper), therefore, the whole nano-twins copper metal layer of the present invention comprises a great number of nano-twins copper. The nano-twins copper of the present invention are stacked in order on the basis of a [111] surface, and forming a crystal grain 16 having a preferred direction.

In the present invention, more preferably, at least 50% of crystal grains have a longitudinal axis, the longitudinal axis; the longitudinal axis would show the direction of stacking/growth (or long axis). At the same time, the twins copper metal layer has thickness direction, and the thickness direction is perpendicular to a surface of the twins copper metal layer. An angle included between the [111] crystal axis of the crystal grain and the longitudinal axis is 0 to 20°, and it is preferred that the longitudinal axis direction of the crystal grain is essentially identical to the twins metal layer's thickness direction.

In the above mentioned electrodeposited nano-twins copper metal layer, it is preferred that at least 90% of surface of the nano-twins copper metal layer is [111] surface; it is more preferred that at least 100% of surface of the nano-twins copper metal layer is [111] surface, meaning that all surfaces exposed in nano-twins copper metal layer is [111] surface.

Furthermore, in the electrodeposited nano-twins copper metal layer of the present invention, it is more preferred that at least 70% of the crystal grains is formed as a result of the stacking of plural nano-twins; it is much more preferred that at least 90% of the crystal grains is formed as a result of the stacking of plural nano-twins.

In the present invention, the electrodeposited nano-twins copper metal layer is preferred to further include a seed layer, which takes up 1%-50% of the volume of the nano-twins copper metal layer, for which it is preferred to be 1%-40% of the volume, it is more preferred to be 1%-30% of the volume, and even more preferred to be 1%-10% of the volume. Because at the start of electrodeposition, a bit of seed layer will extend to cover the substrate's surface, therefore there will likely be a bit of seed layer not composed of twins copper on the bottom portion of the nano-twins copper metal layer that is formed accordingly.

Similarly, it would follow that the existence of a seed layer can be used as one of the determining conditions for calling whether an electrodeposition was used as a means of production. For example, a seed layer would not be put to use if the metal layer was produced by sputtering, and no impure elements would exist in the elemental analysis. However, such means of production suffers from drawbacks including slow speed rate, high equipment cost, therefore it is less likely to be used in large-scale production setting. Furthermore, if there was any disturbance during the electrodeposition process, such complexity could lead to partly impure crystal grains in between crystal grains, wherein the impure grain would include impure elements in addition to copper (including oxygen, sulfur, carbon, phosphorus, etc.). In this case, the crystal grain is not formed as a result of the stacking of nano-twins copper; or the angle included between the stacking direction of the nano-twins in the impure crystal grains and the [111] crystal axis is greater than 20°.

In the electrodeposited nano-twins copper metal layer of the present invention, the crystal grain has a diameter preferably of 0.1 µm-50 µm, more preferably 1 µm-10 µm. The thickness of the crystal grain is preferred to be 0.01 µm-500 µm, and more preferably 0.1 µm-200 µm.

In addition, the electrodeposited nano-twins copper metal layer of the present invention has excellent mechanical property and electro-migration characteristics, which can be applied in the production of through silicon via, semiconductor chip interconnect, packaging substrate pin through hole, various metal interconnect, or substrate circuit, of three-dimensional integrated circuit (3D-IC), which can find great use in technological applications for integrated circuit industry.

Another object of the present invention is to provide a method for preparing the nano-twins copper metal layer, which uses electrodeposition to produce a nano-twins metal layer of a thickness of submicron to over tens of microns, and can moderate the crystallographic ordering arrangement or the nano-twins metal layer, to make a highly ordered [111] plane substantially normal to the growth direction.

The method for preparing nano-twins copper metal layer of the present invention comprises the following steps:

(A) providing an electrodepositing device, wherein the electrodepositing device comprises an anode, a cathode, a plating solution, and an electrical power supply source, and the electrical power supply source is connected with the cathode on one end, and connected to the anode on the other end; and (B) using the electrical power supply source to provide electrical power to carry out electrodepositing, with a surface of the cathode used for growing nano-twins copper metal layer; wherein over 50% of a volume of the nano-twins copper metal layer comprise s a plurality of crystal grains, each of the plurality of crystal grain is connected with one another, and each crystal grain is formed as a result of the plurality of nano-twins working to stack in the direction of the [111] crystal axis, for which an angle included between neighboring crystal grains is 0 to 20° in a stacking direction, and the plating solution comprises: a copper-based salt compound, an acid, and chloride anion supply source.

The electrodeposited nano-twins metal layer of the present invention features a structure completely different from the commonly known arts. In particular, the electrodeposited nano-twins metal layer has crystal grains having substantially preferred orientation in [111] and in the meantime highly dense nano-twins, the thickness of the crystal grain can reach approximately above 20 micrometers (even above hundreds of micrometers), the density of the nano-twins in the whole metal material surpasses these produced by commonly known arts, and make for outstanding anti electromigration and mechanical characteristics, and altogether make for practical sizes required in various electronic parts, showing worth for mass production.

The present invention uses electrodeposition to produce nano-twins copper metal layer having a preferred direction, the nano-twins copper metal layer at least has 50% of surface as [111] surface, meaning that a [111] surface of a nano-twins is exposed on over 50% of surface of a nano-twins copper metal layer. In addition, the angle included between the crystal axis [111] direction of the crystal grain and growth direction (that is, nano-twins stacking direction) is within 20°, and it is preferred that the crystal grain has substantially identical [111] direction.

For the plating solution mentioned above, one of the primary functions of the chloride anion is to fine-tune the growth direction of crystal rains, and to therefore equip twins with preferred crystallization orientation. Furthermore, the acid can be an organic acid or inorganic acid, for increasing electrolyte concentration to improve rate of electrodeposition, for which choice of use for the acid can be sulfuric acid, methane sulfonic acid, or a combination thereof.

Furthermore, the acid concentration in the plating solution is preferred to be 80-120 g/L. Even more, the plating solution should at the same time include copper ion source (that is, copper salts, for example, copper sulfate or methyl sulfonic copper). In a preferred composition of the plating solution, and additives can be further included, which can be selected from a group consisting of gelatin, surfactant, lattice modification agent, and a combination thereof, to adjust the growth orientation of the crystal grain that can be fine-tuned by the additive substances.

In the method for preparing twins metal layer of the present invention, the electrical power source is preferred to be a direct current electrodeposition supply source, or high-speed pulse electrodeposition supply source, or direct current elecrodeposition and high-speed pulse electrodeposition interchangeably, for enhancing twins metal layer formation rate. When direct current electrodeposition is used in the step (B), the electric current is preferred to be 10 mA/cm$^2$–120 mA/cm$^2$, most preferred to be 20-100 mA/cm$^2$ (for example, 80 mA/cm$^2$). When high-speed pulse electrodeposition supply source is used in the step (B), the operation conditions are preferred to be: $T_{on}/T_{off}$ (sec) at 0.1/2-0.1/0.5 (for example, 0.1/2, 0.1/1, or 0.1/0.5), electric current at 10-250 mA/cm$^2$ (most preferably 50 mA/cm$^2$). The growth rate of the nano-twins copper is measured by actual conduction time when it undergoes electrodeposition running the above conditions, which, in a preferred setting, is 0.22 μm/min-2.64 μm/min. For example, when the electric current for electrodeposition is 80 mA/cm$^2$ in step (B), the twins metal growth rate can be between 1.5 μm/min-2 μm/min (for example, 1.76 μm/min). In the present invention, the thickness of the nano-twins copper metal layer can be adjusted according to electrodeposition duration, with the range of the thickness being preferred to be about 0.1 μm-500 μm, more preferred to be 0.8 μm-200 μm, and even more preferred to be 1 μm-20 μm. Compared to the present invention, the twins copper metal layer prepared from generally known technology can only be used as a seed layer because it has no via filling capability, has a preferred orientation, and the mass production thickness can merely be about 0.1 μm. Therefore the known prior arts can only be used as seed layer, and cannot be directly used as interconnect. But the thickness of the electrodeposited nano-twins copper metal layer of the present invention can be 0.1 μm-500 μm, therefore its applicability is very diverse (for example, through silicon via, semiconductor chip interconnect, packaging substrate pin through hole, or metal interconnect). In addition, when the electrodeposition is underway, the cathode or the plating solution can be spun at a rotational speed of 50 to 1500 rpm, so as to help twins growth orientation and speed rate.

In the method for preparing twins metal layer of the present invention, the cathode is preferred to be a substrate having seed layer on a surface, or a metal substrate (for example, copper tinsel substrate, or substrate having copper tinsel on a surface). For example, the substrate can be selected from a group consisting of: silicon substrate, glass substrate, quartz substrate, metal substrate, plastic substrate, printed circuit board, copper tinsel substrate, III-V group material substrate, and a combination thereof. When electrodeposition is underway, the cathode and the plating solution are preferred to be spun at a rotational rate of 50 to 1500 rpm, so as to help columnar crystal grains grow.

The crystal grain obtained by the method for preparing nano-twins copper metal layer of the present invention has a diameter preferably of 0.1 μm-50 μm, more preferably 1 μm-10 μm; the crystal grain has a thickness preferably of 0.01 μm-500 μm, more preferably 0.1 μm-200 μm.

The nano-twins copper metal layer prepared by the method of the present invention has excellent mechanical property and electro-migration, can be used in the preparation of through silicon via, packaging substrate pin through hole, various electrical interconnect, or substrate circuit and others for three-dimensional integrated circuit (3D-IC). These can find great use in the technological application for integrated circuit industry.

In addition, the present invention further provides a substrate having nano-twins copper metal layer, comprising: a substrate; and the above mentioned nano-twins copper metal layer, which is disposed on a surface or interior of the substrate. Wherein, the substrate is selected from a group consisting of silicon substrate, glass substrate, quartz substrate, metal substrate, plastic substrate, printed circuit board, III-V group material substrate, and a combination thereof.

The substrate having the nano-twins copper metal layer of the present invention can comprise packaging substrate having wire layer, three-dimensional integrated circuit (3D-IC) board and others. That is, in the substrate having the nano-twins copper metal layer of the present invention, the nano-twins copper metal layer can be used a s through silicon via, pin through hole, any metal interconnect, or substrate circuit, and others.

The method for preparing twins metal of the present invention takes significantly shorter time than the generally known physical phase deposition method or pulse electrodeposition, has faster deposition rate and speed, making call for expensive vapor phase deposition device unnecessary, therefore production cost can be significantly reduced.

DETAILED DESCRIPTION OF THE PREFERRED EMBODIMENT

Hereafter, examples will be provided to illustrate the embodiments of the present invention. Other advantages and effects of the invention will become more apparent from the disclosure of the present invention. Other various aspects also may be practiced or applied in the invention, and various modifications and variations can be made without departing from the spirit of the invention based on various concepts and applications.

The figures presented herein are simplified diagrams showing examples of the current invention. It must be understood that the figures are only illustrative of the associated elements of the current invention, and are not intended to be the actual embodiments. The number, shape and other dimensions of the elements in the actual embodiments are chosen for specific design purposes, and their configuration and pattern may be more detailed.

Example 1

Figure 1:
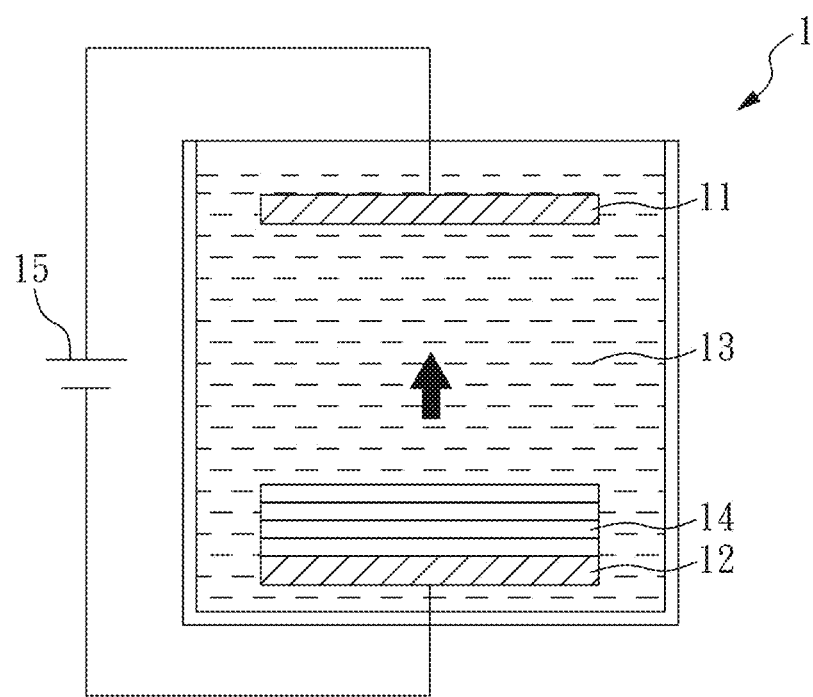
FIG. 1 is a diagram showing an electrodepositing device according to Example 1 and 2 of the present invention.

An electrodepositing device 1 as shown in FIG. 1 is provided, the electrodepositing device 1 comprises an anode 11, a cathode 12, which are immersed in the plating solution 13 and are each connected to a direct current electrical power supply source 15 (Keithley 2400 is used herein). In the present case, the anode 11 is made from a material including metal copper, phosphorus copper or inert anode (for example, titanium-plated platinum); cathode 12 is made from a material including silicon substrate having its surface plated by copper seed layer, and can be made from a material selected from a group consisting of glass substrate having its surface plated by conductive layer and seed layer, conductive layer and seed layer plated surface glass substrate, quartz substrate, metal substrate, plastic substrate, or printed circuit board etc. The plating solution 13 comprises copper sulfate (copper ion concentration being 20-60 g/L), chloride anion (concentration being 10-100 ppm), and methane sulfonic acid (concentration being 80-120 g/L), and other surfactant or lattice modification agent (such as BASF Lugalvan 1-100 ml/L) can be added. The plating solution 13 of the present example can further comprises organic acid (for example, methane sulfonic acid), or gelatin etc., or a combination thereof for adjusting crystal grain composition and size.

Next, a direct current having a 20-100 mA/cm$^2$ electric current is used in electrodeposition, in which nano-twins are grown from the cathode 12 in the direction pointed by the arrow as shown in FIG. 1. A rotational speed of about 50 to 1500 rpm is applied on silicon chip or solution. During the growth process, the [111] surface of the twins and the planar surface of the nano-twins copper metal layer are roughly perpendicularly to the electric field orientation, and the twins copper is grown at about 1.76 μm/min. The fully grown nano-twins copper metal layer comprises a plurality of crystal grains, wherein the crystal grins are formed by a plurality of twins copper. Since the nano-twins extend to reach the surface, [111] surface is still exposed on the surface. The thickness of the twins copper 14 achieved from electrodeposition is approximately 20 μm. [111] crystal axis is an axis normal to the [111] surface.

Figure 2A:
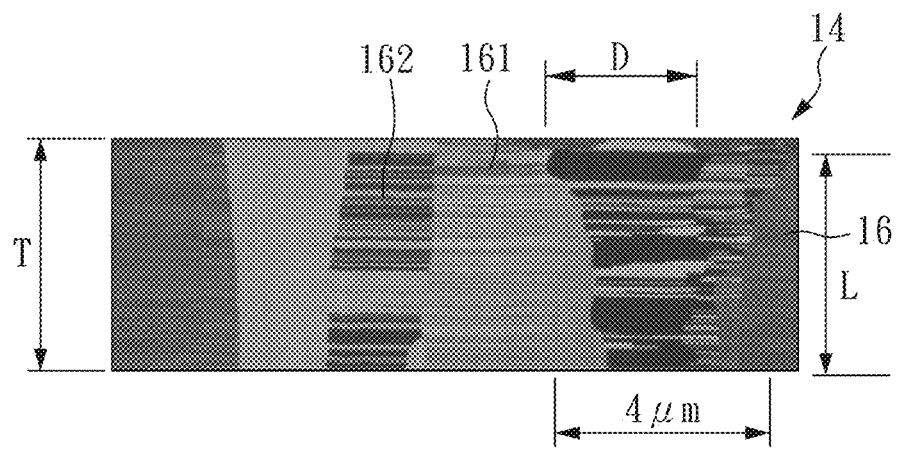
FIG. 2A shows a cross-sectional focused ion beam (FIB) photo of a nano-twins copper metal layer according to Example 1 of the present invention.
Figure 2B:
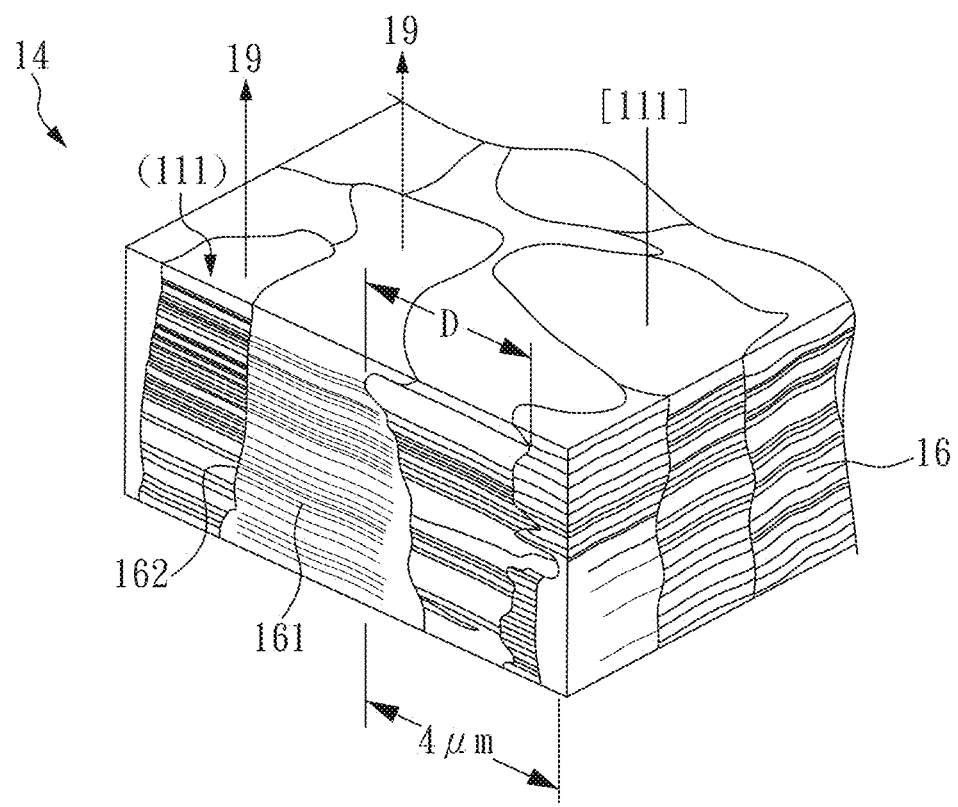
FIG. 2B is an isometric representation of a nano-twins copper metal layer according to Example 1 of the present invention.

FIG. 2A is a cross-sectional focused ion beam (FIB) photo of the twins copper prepared with 80 mA/cm$^2$ of the present example according to the current example, and FIG. 2B is an isometric representation of the nano-twins copper layer of the present example. According to FIGS. 2A and 2B, over 50% of volume of the nano-twins copper layer 14 prepared in the current example comprises a plurality of columnar crystal grains 16, and each crystal grain has a plurality of layer-shaped nano-twins copper (for example, neighboring black line and white line constitute a twins copper, and are stacked in a stacking direction 19 to form crystal grains 16), therefore, the whole nano-twins copper metal layer of the present invention comprises a significant number of nano-twins copper. The diameter D of these columnar crystal grains 16 can range from about 0.5 μm to 8 μm and the height L can range from about 2 μm to 20 μm, nano-twins plane 161 (level striation) and the [111] planar surface are parallel to each other, crystalline grain boundary 162 can be found between twins crystals, the [111] plane surface of copper is perpendicularly to the T direction of thickness, and the thickness T of the twins copper layer 14 is about 20 μm. The angle included between stacking direction of neighboring crystals (which are almost identical to [111] crystal axis) ranges between 0° and 20°.

In the present embodiment, the thickness T of the twins copper layer 14 can be adjusted based on electrodeposition duration, which ranges about 0.1 μm-500 μm.

Figure 3:
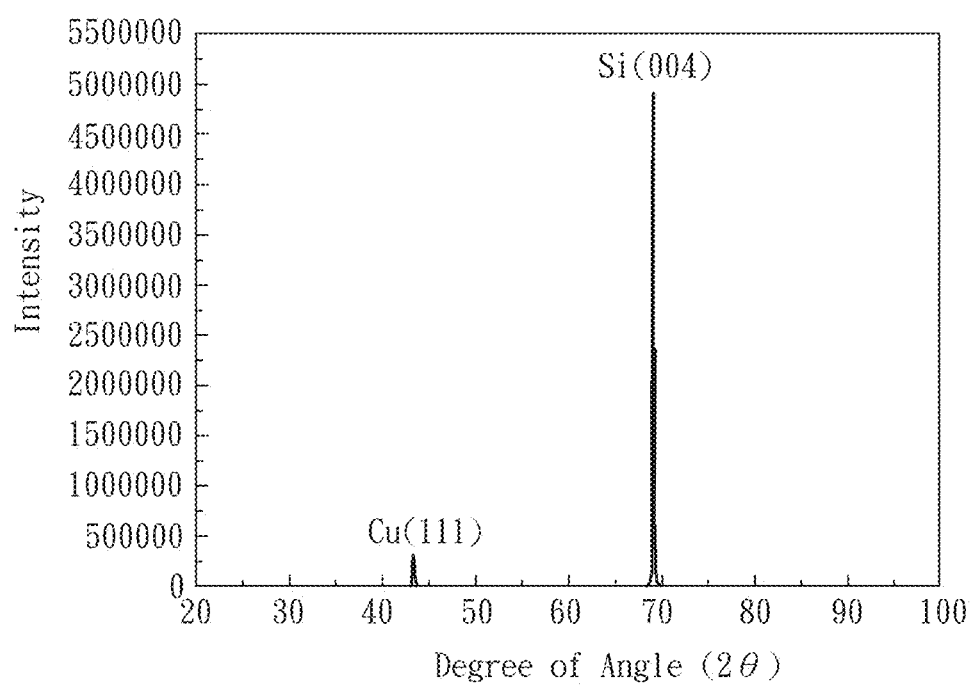
FIG. 3 is an exemplary display of X-ray analysis result from a plan-view for a columnar crystal of nano-twins copper metal layer according to Example 1 of the present invention.

As shown in FIG. 3, a result from X-ray analysis for a plan-view of nano-twins copper metal layer according to the present example is shown. X-ray is incidentally shot through the electrodeposited copper surface. As will be seen in FIG. 3, the electrodeposited layer crystal grain has a preferred orientation of [111] crystal axis (as shown by Cu(III) in FIG. 3). The Si(004) in the drawing is the diffraction peak of the silicon substrate. Other planar diffraction peaks of copper are not present, indicating that the copper prepared by the present example has [111] crystal axis.

Figure 4:
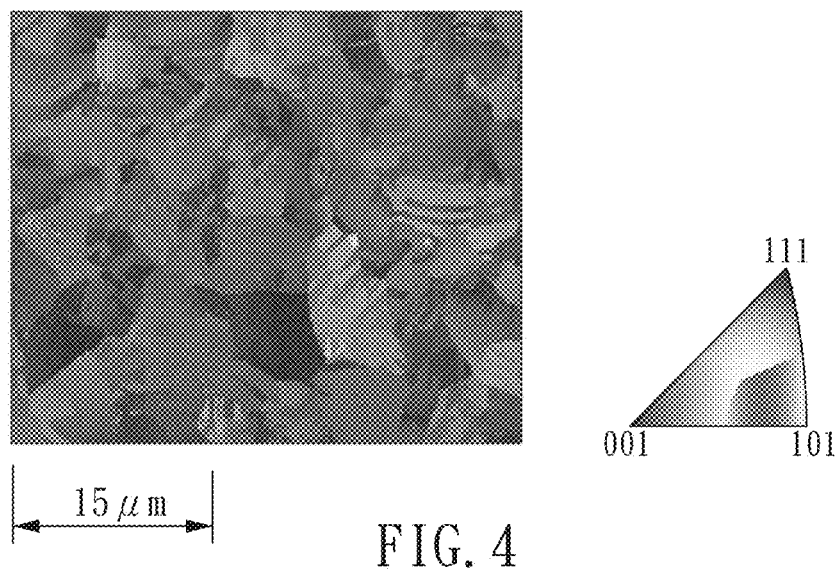
FIG. 4 is an exemplary display of EBSD pattern for a columnar crystal of nano-twins copper metal layer according to Example 1 of the present invention.
Figure 5:
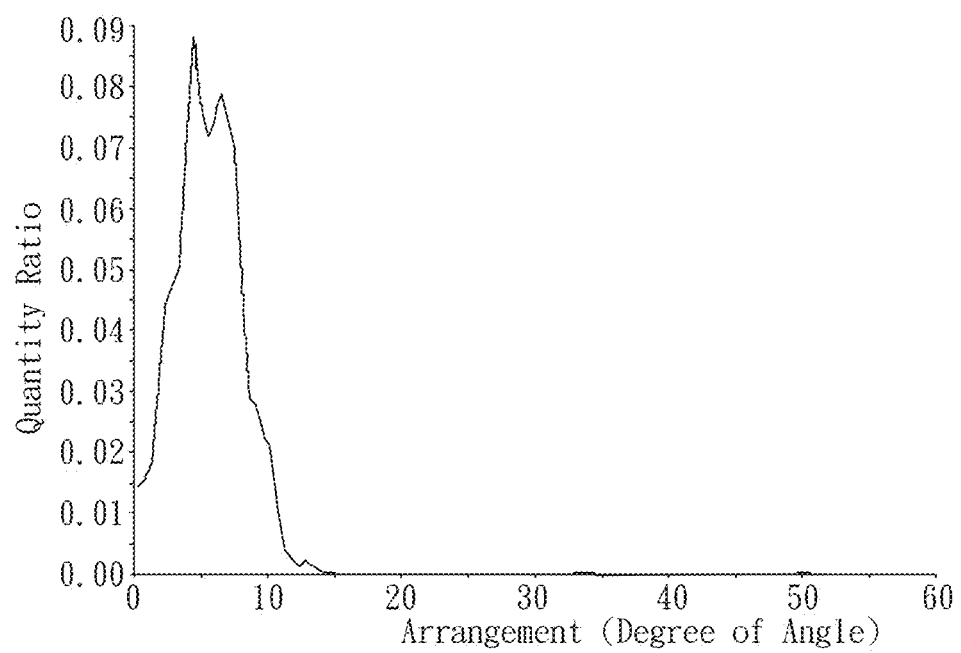
FIG. 5 shows a statistical analysis result for a crystal of nano-twins copper metal layer of FIG. 4 deviating from an angle to positive [111] direction according to Example 1 of the present invention.

FIG. 4 shows the result of using electron backscatter diffraction (EBSD) as a means of analyzing the surface crystal orientation, which shows that all surface crystal grain orientation are centered around [111] orientation, which is the color blue. FIG. 5 shows the statistical study result for these crystal grains deviating from [111] orientation angle, it can be seen that the percentage of crystal grains whose angle deviating from the [111] orientation by within 10° (<10°) is over 90%.

Figure 6:
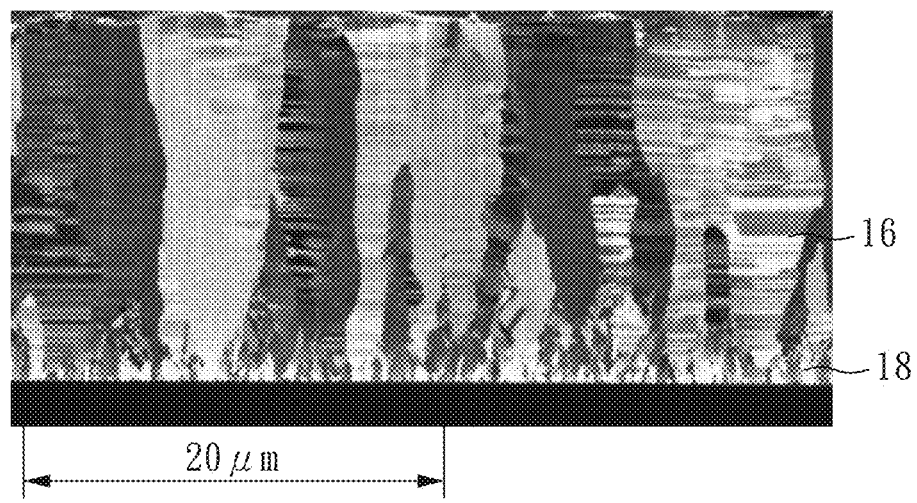
FIG. 6 is a cross-sectional focused ion beam (FIB) photo of a nano-twins copper metal layer prepared by direct current electroplating at 20 mA/cm$^2$ according to Example 1 of the present invention.
Figure 7:
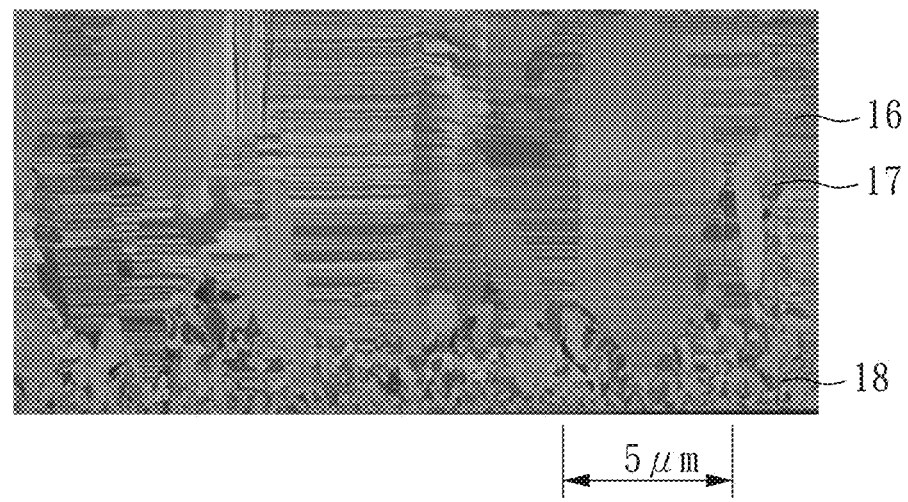
FIG. 7 is a cross-sectional focused ion beam (FIB) photo of a nano-twins copper metal layer prepared by direct current electroplating at 40 mA/cm$^2$ according to Example 1 of the present invention.
Figure 8:
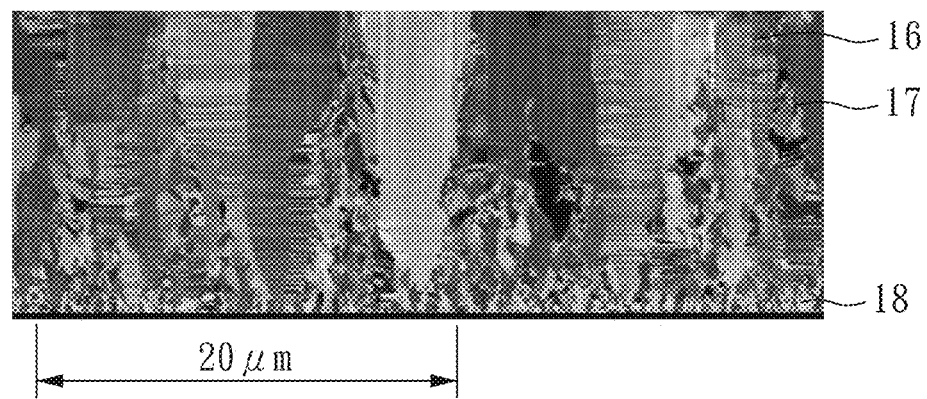
FIG. 8 is a cross-sectional focused ion beam (FIB) photo of a nano-twins copper metal layer prepared by direct current electroplating at 100 mA/cm$^2$ according to Example 1 of the present invention.

Furthermore, the nano-twins copper metal layer having [111] preferred orientation of the present invention can also be obtained from other electric current density condition, as shown in the cross-sectional FIG photos of FIGS. 6-8, where the electric currents are each 20 mA/cm$^2$, 40 mA/cm$^2$, and 100 mA/cm$^2$, it can also be seen in the diagram that the twins copper obtained by other electric current also has [111] preferred orientation.

As seen in FIG. 6, FIG. 7, or FIG. 8, in the present invention, impure crystal grains 17 can be found between columnar crystal grains 16, and a surface of the nano-twins copper metal layer has some seed layers 18. The reason for such establishment is that the substrate surface would be covered by some seed layers 18 at the start of electrodeposition, therefore some seed layers 18 not composed by copper can be found on the formed nano-twins copper metal layer. Therefore, the nano-twins copper metal layer of the present invention is defined to have a characteristics of "over 50% of volume comprises a plurality of crystal grains, each of the crystal grain is formed by the stacking of a plurality of nano-twins along [111] crystal axis orientation."

Example 2

The combination of electrodepositing device and plating solution of the present example is the same as in Example 1, but pulse electrodeposition is used for plating instead of direct current power supply source. Silicon chip or solution is subject to rotation at a rate of about 0 to 1500 rpm. $T_{on}/T_{off}$ is kept below 0.1/0.5 (sec), electric current density is kept at 50 mA/cm$^2$, and twins copper is grown (plating 6000 cycles) from cathode moving toward the direction pointed by the arrow (as shown in FIG. 1). [111] plane of the twins is perpendicular to the orientation of electric field, and twins copper is grown at a rate of 0.183 μm/min. The fully grown twins copper comprises a plurality of columnar crystal grains; the columnar crystal grain has a plurality of layer-shaped nano-twins copper, and the thickness of the nano-twins copper layer obtained after electrodeposition is about 10 μm.

Figure 9:
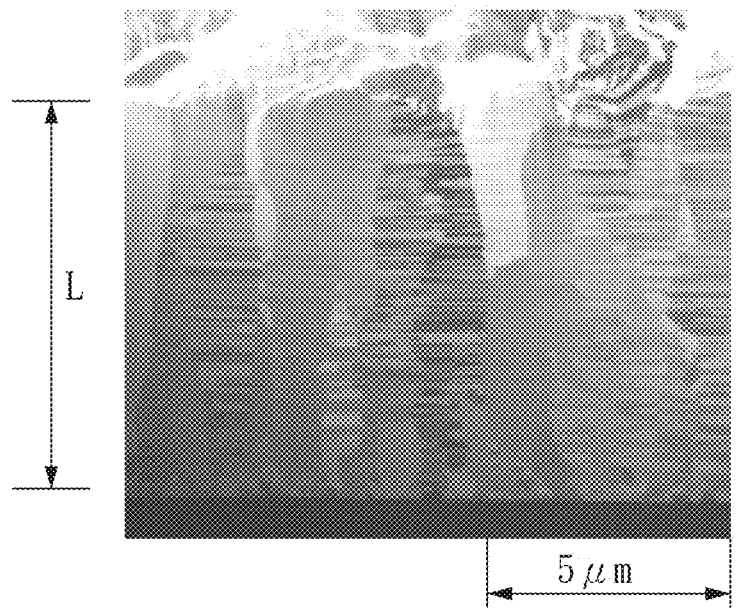
FIG. 9 is a cross-sectional focused ion beam (FIB) photo of a nano-twins copper metal layer prepared by direct current electroplating at 50 mA/cm$^2$ according to Example 2 of the present invention.

FIG. 9 is a cross-sectional focused ion beam (FIB) photo of the nano-twins copper metal layer prepared in the current example. As shown in FIG. 9, over 50% of volume of the nano-twins copper metal layer prepared in the current example comprises a plurality of crystal grains, the diameter D of the crystal grain ranges from about 0.5 μm to 8 μm, the level striation is the nano-twins layer (for example, neighboring sets of black lines and white lines constitute a twins copper), the [111] plane of copper and twins plane are substantially cover 50% perpendicular to the orientation of thickness T, and the thickness T of crystal grain is about 10 μm.

Figure 10:
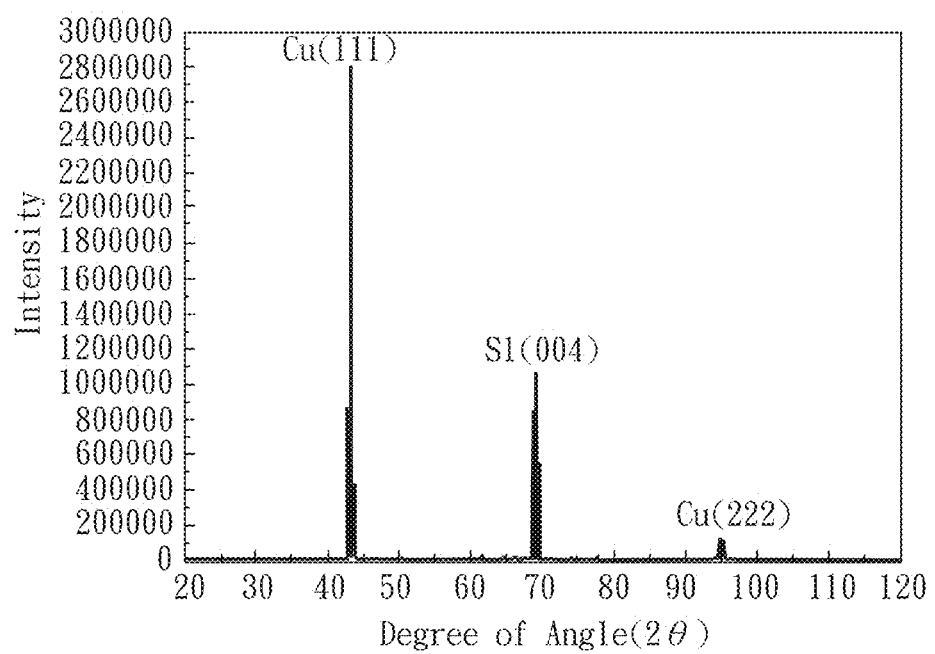
FIG. 10 shows a result of X-ray analysis from a plan view for a crystal grain of a nano-twins copper metal layer prepared by pulse electrodepositing according to Example 2 of the present invention.

Furthermore, as shown in FIG. 10, a result diagram displaying X-ray analysis of the nano-twins copper layer prepared by the present example is provided. The result shows that the nano-twins copper layer prepared by electrodepositon of the current example has a favorable [111] preferred orientation for which the intensity of diffraction of 280,000 counts is higher than the diffraction peak of the silicon chip, and for higher than Cu(222) diffraction peak, indicating that the twins copper layer prepared by the current example has a more favorable [111] preferred direction than that done by direct current.

Example 3

The plating solution and method of the present example is the same as Example 1, but is different in an aspect that the current example has wire channel prepared by a semiconductor manufacturing process on the substrate surface, the micro through holes of the aspect ratio of 1:3, and that the nano-twins copper metal layer uses electrodeposition to fill holes and in turn forms interconnect.

Example 4

Figure 11:
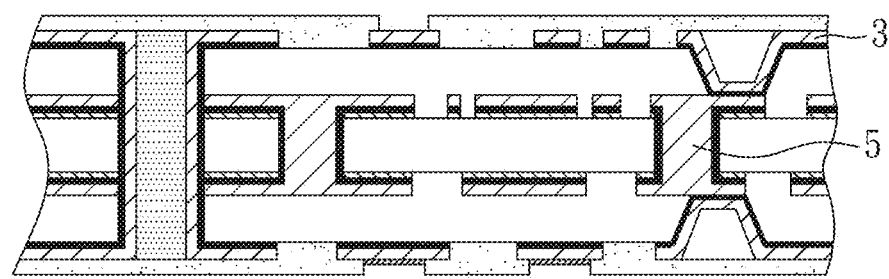
FIG. 11 is a perspective view showing a wire substrate according to Example 4 of the present invention.

As shown in FIG. 11, a circuit substrate is provided, which includes the same nano-twins copper metal layer prepared in Example 3. In other words, the nano-twins copper metal layer of the present example can be used in wires 3, and/or conductive throughhole 5. In addition, it can also be used in the three-dimensional integrated circuit, etc.

And with regards to substrate material, the substrate can be silicon substrate, glass substrate, quartz substrate, metal substrate, printed circuit board, or III-V group material substrate.

Testing Example

Figure 12:
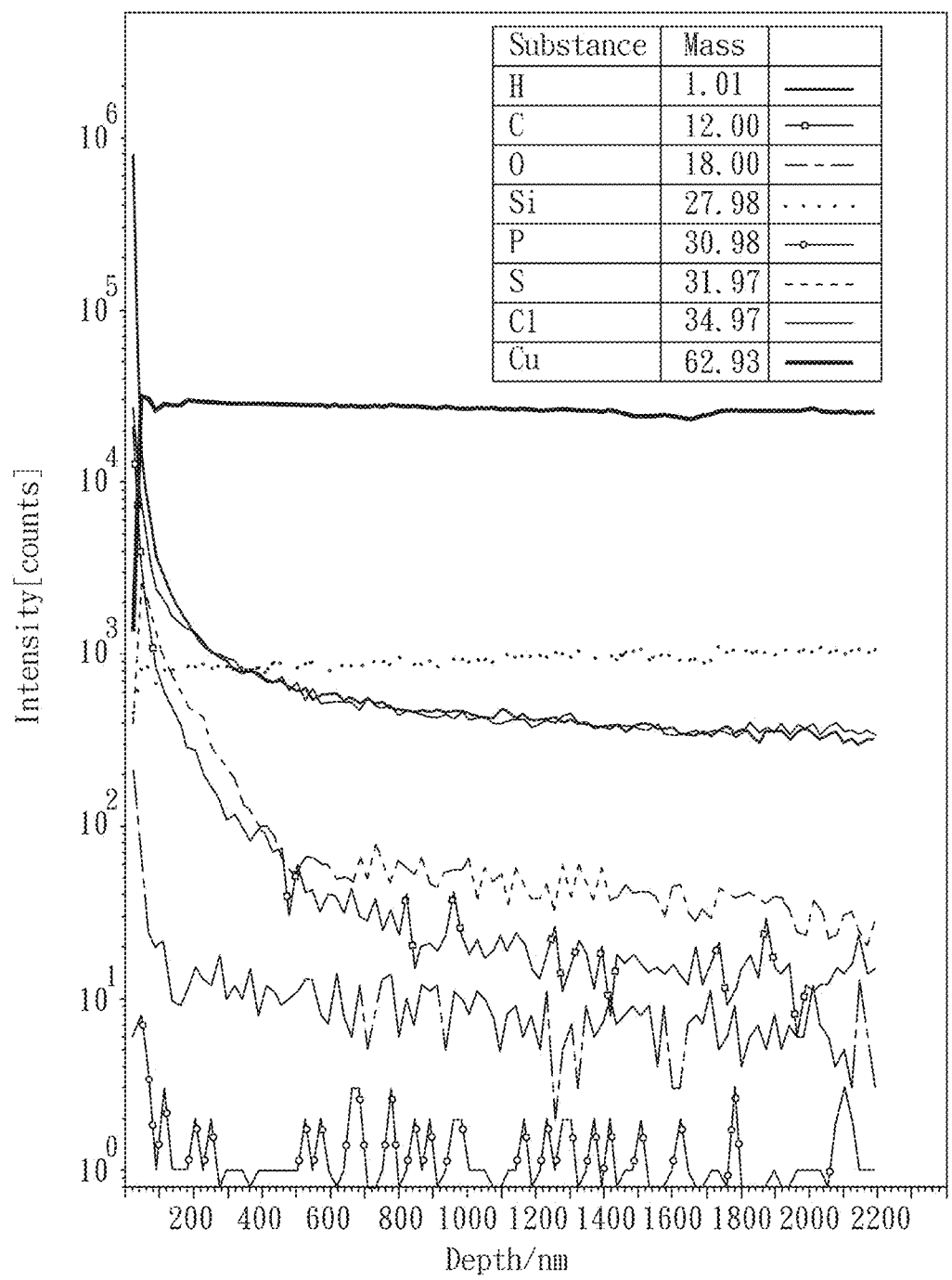
FIG. 12 is a display and graph of elemental analysis according to testing example of the present invention.

As shown in FIG. 12, an elemental analysis is conducted based on the nano-twins copper metal layer as prepared in Example 1. Testing conditions are shown in Table 1 below. By reference to the current figure, it can be observed that the nano-twins copper metal layer prepared from the electrodepositing method of the present invention would comprise a handful of impure grains, where these impure grains would include impure elements in addition to copper (for example, oxygen, sulfur, carbon, phosphorous, and others). However, the nano-twins copper metal layer would be devoid of these impure elements in the case of manufacture by sputtering.

TABLE 1

| Sample Parameter | Analytical Parameter | Sputtering Parameter |
| --- | --- | --- |
| Sample: 80 mA/cm$^2$ | PI: Ga | PI: Cs |
| Polarity: Negative | Energy: 25 KeV | Energy: 2 KeV |
|  | Charge current: 1.00 pA | Charge current: 45.00 pA |
|  | Area: 65.4 × 65.4 µm$^2$ | Area: 250.1 × 250.1 µm$^2$ |

What is claimed is:

1. A method for preparing a nano-twins copper metal layer, comprising:
   (A) providing an electrodepositing device, wherein the electrodepositing device comprises an anode, a cathode, a plating solution, and an electrical power supply source, and the electrical power supply source is connected to the anode and the cathode; and
   (B) using the electrical power supply source to provide an electrical power to perform electrodeposition at a surface of the cathode to grow a nano-twins copper metal layer; wherein over 50% of a volume of the nano-twins copper metal layer comprises a plurality of crystal grains, each crystal grain is connected with one another, each crystal grain is formed as a result of a plurality of nano-twins stacking in a direction of a [111] crystal axis, and an angle included between neighboring crystal grains is 0° to 20°;
   wherein the plating solution comprises a copper-based salt compound, an acid, and a chloride anion supply source; and
   wherein the method is used in a preparation of through silicon via (TSV), interconnect of a semiconductor chip, pin through hole of a packaging substrate, metal wire, or substrate circuit.

2. The method according to claim 1, wherein a [111] surface of the nano-twins is exposed on over 50% of a surface area of the nano-twins copper metal layer.

3. The method according to claim 1, wherein a diameter of the crystal grains is in a range of 0.01 µm-500 µm and a thickness of the crystal grains is in a range of 0.01 µm-500 µm.

4. The method according to claim 1, wherein a diameter of the crystal grains is in a range of 1 µm-10 µm and a thickness of the crystal grains is in a range of 0.1 µm-200 µm.

5. The method according to claim 1, wherein the plating solution further comprises a substance selected from a group consisting of gelatin, surfactant, lattice dressing agent, and a combination thereof.

6. The method according to claim 1, wherein the acid in the plating solution is sulfuric acid, methane sulfonic acid, or a combination thereof.

7. The method according to claim 1, wherein a concentration of the acid in the plating solution is 80-120 g/L.

8. The method according to claim 1, wherein in step (B), a current density for electrodeposition is 10-120 mA/cm$^2$.

9. The method according to claim 1, wherein a growth rate of the nano-twins copper metal layer is 0.22 µm/min-2.64 µm/min.

10. The method according to claim 1, wherein in step (B), a growth rate of a twins metal is 1.5 µm/min-2 µm/min when a current density for electrodeposition is 80 mA/cm$^2$.

11. The method according to claim 1, wherein in step (B), electrodeposition is carried out by direct current electrodeposition, pulse electrodeposition, or both interchangeably.

12. The method according to claim 1, wherein the cathode is a substrate with a seed layer on a surface of the substrate, or a metal substrate.

13. The method according to claim 12, wherein the substrate is selected from a group consisting of silicon substrate, glass substrate, quartz substrate, plastic substrate, printed circuit board, III-V group material substrate, and a combination thereof.

14. The method according to claim 1, wherein in step (B), when the electrodeposition is in progress, the cathode or the plating solution is spun at a rotational speed of 50 rpm-1500 rpm.

* * * * *